(12) United States Patent
McDermott et al.

(10) Patent No.: US 12,740,330 B2
(45) Date of Patent: Sep. 15, 2026

(54) SUBSTRATE MODIFICATIONS TO SUPPRESS CORRELATED ERRORS IN MULTIQUBIT ARRAYS

(71) Applicant: Wisconsin Alumni Research Foundation, Madison, WI (US)

(72) Inventors: Robert Francis McDermott, Madison, WI (US); Mark A. Eriksson, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1315 days.

(21) Appl. No.: 17/546,491

(22) Filed: Dec. 9, 2021

(65) Prior Publication Data

US 2025/0331430 A1 Oct. 23, 2025

Related U.S. Application Data

(60) Provisional application No. 63/123,779, filed on Dec. 10, 2020.

(51) Int. Cl.
*H10N 60/80* (2023.01)
*H10N 60/12* (2023.01)

(52) U.S. Cl.
CPC ........... *H10N 60/805* (2023.02); *H10N 60/12* (2023.02)

(58) Field of Classification Search
CPC ...... H10N 60/805; H10N 60/12; H10N 69/00; H10N 60/815; H10N 60/00-99; H10N 99/05; H10D 48/3835; B82Y 10/00; G06N 10/70; G06N 10/40
See application file for complete search history.

(56) References Cited

U.S. PATENT DOCUMENTS 9,928,827 B1 * 3/2018 El-Kady ................ B82Y 10/00
10,692,009 B2 6/2020 Kelly
2019/0044543 A1 2/2019 Chamberland et al.
2020/0341837 A1 10/2020 Cross et al.
2021/0263117 A1 * 8/2021 Braje ..................... G01R 33/24
2021/0399192 A1 * 12/2021 Gill ........................ G06N 10/40

FOREIGN PATENT DOCUMENTS

KR 10-2018-0112759 10/2018
WO WO-2017116442 A1 * 7/2017 ............. G06N 10/40
WO WO2019/055038 3/2019

OTHER PUBLICATIONS

P. Baireuther et al. "Machine-learning-assisted correction of correlated qubit errors in a topological code". Quantum, vol. 2. pp. 1-10. Jan. 29, 2018.

(Continued)

*Primary Examiner* — Shahed Ahmed
(74) *Attorney, Agent, or Firm* — Bell & Manning, LLC

(57) ABSTRACT

Qubit arrays having substrates that are engineered to suppress correlated dephasing errors, correlated relaxation errors, or both are provided. Also provided are quantum circuits incorporating the qubit arrays and quantum computers incorporating the quantum circuits. The engineered substrates can be used to suppress noise and correlated errors in any qubit array that suffers from charge fluctuations or other noise that creates a non-equilibrium, error-producing state in the qubit array.

20 Claims, 10 Drawing Sheets

(56) References Cited

OTHER PUBLICATIONS

Austin G. Fowler et al. "Quantifying the effects of local many-qubit errors and nonlocal two-qubit errors on the surface code". Physical Review A, vol. 89, Issue 3. pp. 1-7. Mar. 12, 2014.
International Search Report and Written Opinion issued for PCT/US2021/062583, Jan. 8, 2022, pp. 1-10.
Childress, et al., "Diamond NV centers for quantum computing and quantum networks," MRS Bulletin, Feb. 1, 2013, pp. 134-138, vol. 38, No. 2, XP055738266, US, ISSN: 0883-7694, DOI: 10.1557/mrs.2013.20.
Extended European Search Report in EP Patent Application No. 21904391.6 dated Apr. 25, 2024, 11 pages.
Mykkanen, et al., Efficient thermionic operation and phonon isolation by a semiconductor-superconductor junction, arxiv.org, Sep. 9, 2018, 10 pages, XP081662451, DOI: 10.1126/SCIADV.AAX9191.
Mooij, Hans, "Superconducting quantum bits," *Physics World*, 17.12 (2004) 29.
Kockum et al., "Quantum Bits with Josephson Junctions," Chapter 17 from *Fundamentals and Frontiers of the Josephson Effect*, Spring Series in Materials Science 286, 2019, pp. 703-741.
Gu et al., "Microwave photonics with superconducting quantum circuits," *Physics Reports*, 718-719 (2017) 1-102.
Wilen et al., "Correlated Charge Noise and Relaxation Errors in Superconducting Qubits," arXiv:2012.06029v2 [quant-ph] Dec. 15, 2020.
Stewart et al., "Stability of Single Electron Devices: Charge Offset Drift," Appl. Sci. 2016, 6, 187.
Devoret et al., "Superconducting Qubits: A Short Review," arXiv preprint cond-mat/0411174 (2004).
Christensen et al., "Anomalous Charge Noise in Superconducting Qubits," arXiv:1905.13712v1 [quant-ph] May 31, 2019.
Gustavsson et al., "Suppressing relaxation in superconducting qubits by quasiparticle pumping," Science, Dec. 23, 2016, vol. 354, Issue 6319, 6 pages.
Alejandro Matos, "Overview of Prominent Decoherence Mechanisms in Superconducting Qubits," indico.fnal.gov, downloaded from the internet Dec. 5, 2020.
Jin et al., "It's a trap! On the nature of localized states and charge trapping in lead halide perovskites," Mater. Horiz., 2020, 7, 397.
Bourgeois et al., "Reduction of phonon mean free path: From low-temperature physics to room temperature applications in thermoelectricity," *C.R. Physique* 17 (2016) 1154-1160.
Vepsalainen et al., "Impact of ionizing radiation on superconducting qubit coherence," arXiv:2001.09190v2 [quant-ph] Aug. 27, 2020.
Henriques et al., "Phonon traps reduce the quasiparticle density in superconducting circuits," arXiv:1908.04257v3 [cond-mat.supr-con] Aug. 20, 2019.
Krupka et al., "Dielectric properties of semi-insulating silicon at microwave frequencies," *Appl. Phys. Lett.* 107, 082105 (2015).
Otelaja et al., "Enhancement of phonon backscattering due to confinement of ballistic phonon pathways in silicon as studied with a microfabricated phonon spectrometer," *Applied Physics Letters* 107, 173102 (2015).
Safavi-Naeini et al., "Controlling phonons and photons at the wavelength scale: integrated photonics meets integrated phononics," *Optica*, vol. 6, No. 2, Feb. 2019, pp. 213-232.
Wu et al., "A Faraday Cage Isolation Structure for Substrate Crosstalk Suppression," *IEEE Microwave and Wireless Components Letters*, vol. 11, No. 10, Oct. 2001, 3 pages.

* cited by examiner phonon
403
410
406
e-
402

510
512
503
511
506
502
505
507

SUBSTRATE MODIFICATIONS TO SUPPRESS CORRELATED ERRORS IN MULTIQUBIT ARRAYS

CROSS-REFERENCE TO RELATED APPLICATIONS

The present application claims priority to U.S. provisional patent application No. 63/123,779 that was filed on Dec. 10, 2020, the entire contents of which are incorporated herein by reference.

REFERENCE TO GOVERNMENT RIGHTS

This invention was made with government support under DE-SC0020313 awarded by the Department of Energy. The government has certain rights in the invention.

BACKGROUND

Quantum circuits based on qubit arrays for quantum computing applications are the focus of intense research. The progress of quantum circuit development is hindered by the challenges associated with isolating the qubit modes from sources of noise and dissipation. Various approaches to addressing these challenges in order to achieve fault-tolerant quantum computers are under investigation. One promising approach is the two-dimensional surface code. However, the predicted success of surface code error correction rests on the assumption that errors across a multiqubit array are uncorrelated in space and time. While it is possible to mitigate errors that are uncorrelated or only weakly correlated across neighboring qubits, quantum error correction will break down in the face of simultaneous errors that are correlated over large length scales. Therefore, correlated errors present a substantial obstacle to the realization of fault-tolerant qubit arrays.

SUMMARY

Qubit arrays having substrates that are engineered to suppress correlated errors are provided. Also provided are quantum circuits incorporating the qubit arrays and quantum computers incorporating the quantum circuits.

One example of a qubit array has at least two qubits on or in a surface of a crystalline substrate, the crystalline substrate having a plurality of engineered defects in its crystal structure, wherein the engineered defects suppress correlated errors in the qubits of the qubit arrays.

Another example of a qubit array has at least two qubits on or in a first surface of a substrate, the substrate having plurality of geometric features defined therein, wherein the geometric features suppress correlated errors in the qubits of the qubit arrays.

Another example of a qubit array has at least two qubits on a surface of a substrate, wherein the substrate comprises an electrostatic screening feature that defines a Faraday cage in the substrate, wherein the Faraday cage suppresses correlated errors in the qubits of the qubit array.

Another example of a qubit array has at least two qubits on a surface of a substrate, wherein the substrate comprises a phonon blocking layer that scatters non-equilibrium phonons away from the qubits of the qubit array, thereby suppressing correlated errors in the qubits of the qubit arrays.

BRIEF DESCRIPTION OF THE DRAWINGS

Illustrative embodiments of the invention will hereafter be described with reference to the accompanying drawings, wherein like numerals denote like elements.

DETAILED DESCRIPTION

Qubit arrays having substrates that are engineered to suppress correlated errors, including correlated dephasing errors and/or correlated relaxation errors, are provided. Also provided are quantum circuits incorporating the qubit arrays and quantum computers incorporating the quantum circuits.

The engineered substrates can be used to suppress correlated errors in any qubit arrays that suffer from charge fluctuations or other noise that creates a non-equilibrium, error-producing state in the arrays. The arrays include at least two qubits that are formed on and/or defined within an engineered substrate, but may include more than two qubits.

For example, arrays of at least four, at least 10, at least 100 qubits, or at least 10,000 qubits can be fabricated on and/or in a substrate. The qubits are arranged as a qubit circuit on a qubit chip.

The qubits, which may take on a variety of architectures, are characterized by the ability to isolate a two-level quantum system. Examples of solid-state qubits that can be formed on and/or in the engineered substrates include superconducting qubits, which suffer from charge noise and quasiparticle poisoning, and semiconductor qubits that suffer from charge noise.

Figure 1:
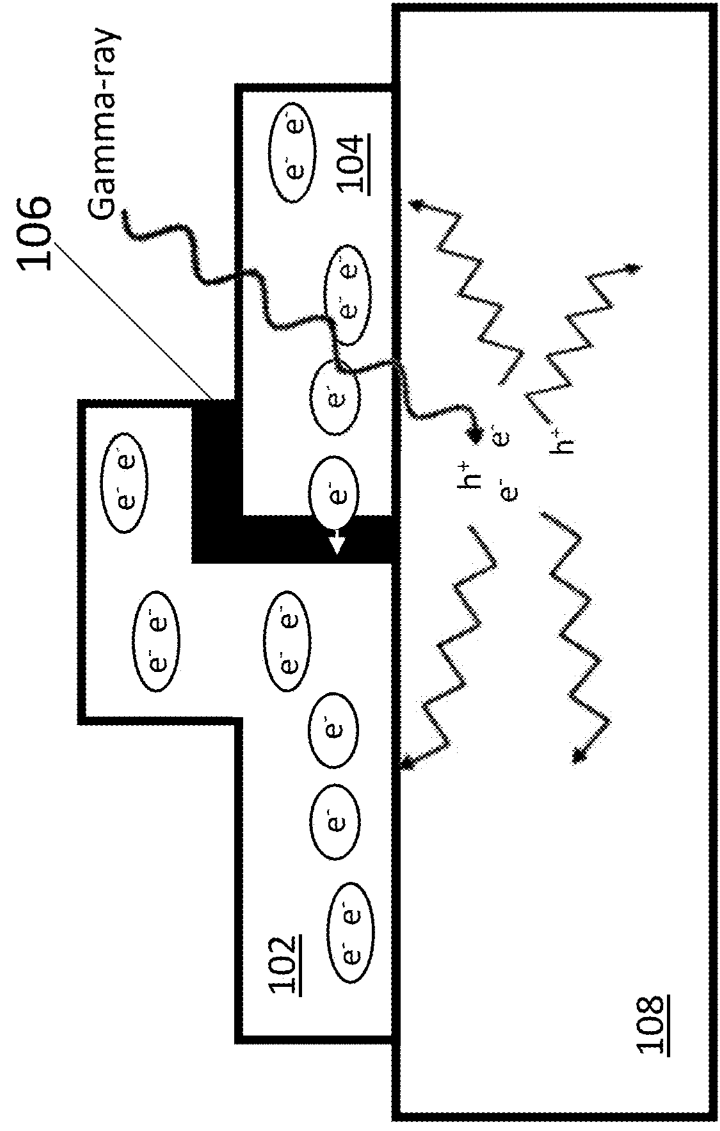
FIG. 1 is a schematic diagram of a cross-sectional view of a Josephson junction on a substrate.

The basic building blocks of superconducting qubits are one or more Josephson junctions, which are composed of two superconducting electrodes separated by a thin insulating barrier that allows for the coherent tunneling of Cooper pairs and the coupling of the wavefunctions on either side of the insulating barrier. One embodiment of a Josephson junction is shown in FIG. 1. The Josephson junction includes two superconducting electrodes 102, 104 separated by a thin dielectric film 106. The junction is supported by a substrate 108. Substrate 108 may be a semiconductor substrate or a dielectric substrate. Substrate 108 may be composed of any semiconductor material on which and/or into which two or more qubits can be formed. Substate 108 is typically crystalline and desirably single-crystalline. The semiconductor substrate may be an intrinsic semiconductor or an externally doped semiconductor, such as intrinsic or externally doped silicon. Examples of materials that can be used to form the substrate, superconducting electrodes, and thin dielectric film are silicon, aluminum (aluminum becomes a superconductor when cooled below ~1.2 K), and aluminum oxide, respectively. However, other materials can be used.

The Josephson junctions can be incorporated into various circuits to make a superconducting qubit. These qubit circuits typically include other electronic components that are electrically connected to a Josephson junction, such as capacitors, inductors, and/or superconducting interconnects or loops. When cooled to sufficiently low temperatures, these superconducting qubits behave as quantum mechanical oscillators exhibiting quantized states.

For the purposes of this disclosure, the Josephson junction (s) along with the other electrical components of a qubit circuit, which are connected to the Josephson junction(s), are considered to form a superconducting qubit. However, additional electronic elements may be coupled to (e.g., magnetically or capacitively coupled to) the superconducting qubits, but are not electrically coupled to a Josephson junction, to form a multiqubit chip. These additional electronic elements, which include gate lines, feedlines, and resonators (e.g., readout resonators) may also be formed on or in the engineered substrates, but are not considered to be part of the qubits.

For purposes of illustration, five designs for superconducting qubits that include one or more Josephson-junctions qubits are charge qubits, flux qubits, phase qubits, transmon qubits, and fluxonium-qubits. These types of qubit circuits, including the Josephson junctions(s) and the electronic components connected thereto, are illustrated in the circuit diagrams shown in FIG. 2, panels (a)-(e).

Figure 2:
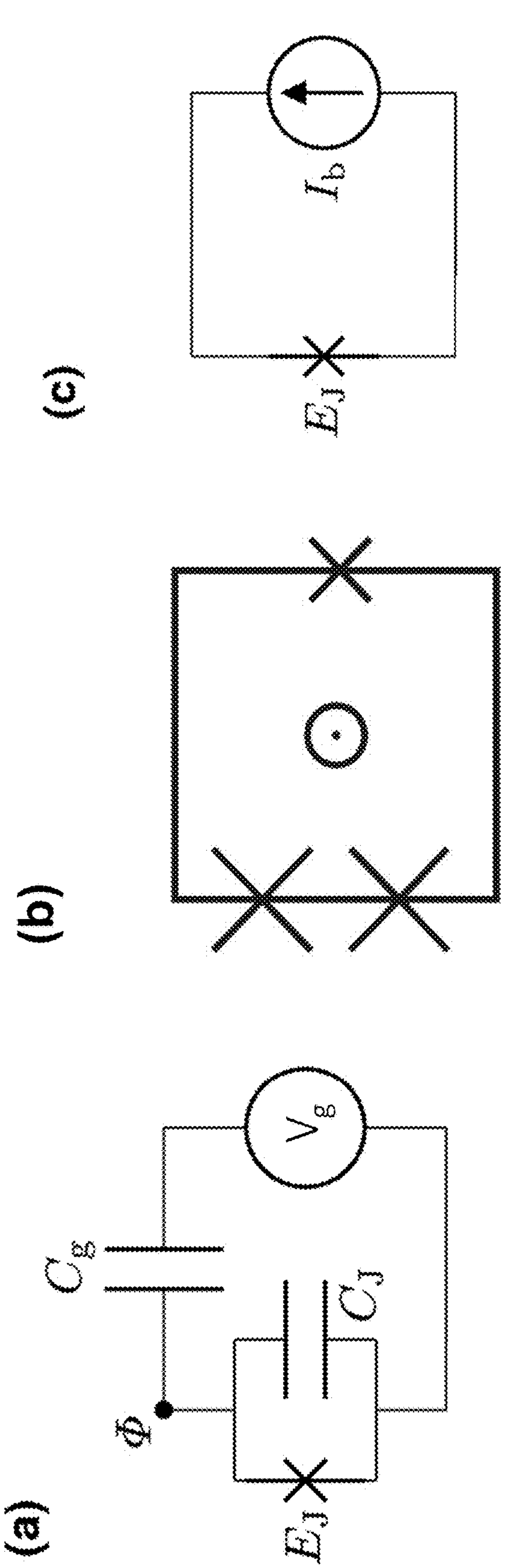
FIG. 2, panels (a) through (e), shows circuit diagrams for five types of superconducting qubits, with each "X" representing a Josephson junction. Panel (a) is a circuit diagram for a charge qubit; panel (b) is a circuit diagram for a flux qubit; panel (c) is a circuit diagram for a phase qubit; panel (d) is a circuit diagram for a transmon qubit; and panel (e) is a circuit diagram for a fluxonium qubit. Capacitance is shown in panel (a). It is also present in the circuits, but is left out of the circuit diagrams for the sake of simplicity.
Figure 2:
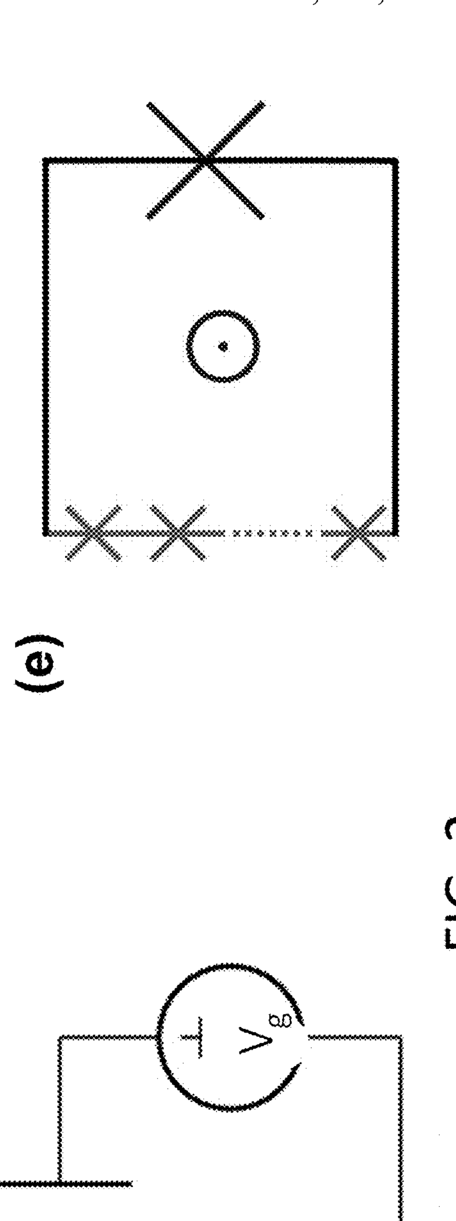
Figure 2:
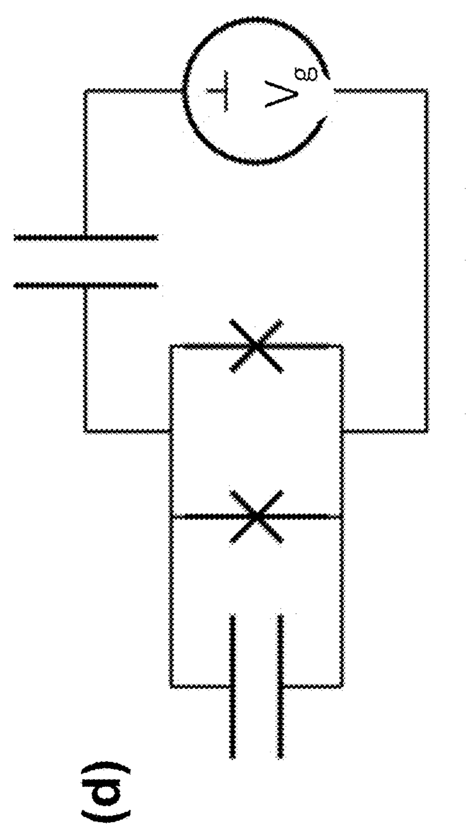

A circuit diagram for a charge qubit, which is also referred to as a Cooper-pair box qubit, is shown in FIG. 2, panel (a). The superconducting charge qubit includes a superconducting island, represented by a dot in the figure, with node flux @, connected to a superconducting reservoir via a Josephson junction. Controlled by an external voltage, providing by an external voltage source (Vg) that is connected to the island through a gate capacitance (Cg), Cooper pairs are able to tunnel on and off the island through the Josephson junction.

A circuit diagram for a flux qubit is shown in FIG. 2, panel (b). A flux qubit is formed from one or more Josephson junctions connected in a closed loop by superconducting leads. In the flux qubit circuit, which is driven by a perpendicular (with respect to the loop) applied external magnetic field, the Josephson junctions act as weak points where transitions between different phase states occur. Some embodiments of flux qubits include only one or two Josephson junctions. However, such flux qubits typically require a large superconducting loop and can be difficult to tune. Therefore, it is often desirable to include three (or more) Josephson junctions in the flux qubit, wherein one of three junctions is smaller than the other two (identical) junctions, as depicted in the figure.

A circuit diagram for a phase qubit is shown in FIG. 2, panel (c). The phase qubit has a one large Josephson junction that is controlled through an applied dc bias current (Ib). In a phase qubit, the two quantum levels are determined by oscillations of the phase difference between the electrodes of the Josephson junction.

A circuit diagram for a transmon qubit is shown in FIG. 2, panel (d). A transmon qubit can be formed by adding another capacitance in parallel with the Josephson junction of the charge-qubit circuit of FIG. 2, panel (a). Transmon qubits operate in a regime of increased ratio of Josephson energy and charging energy.

A circuit diagram for a fluxonium qubit is shown in FIG. 2, panel (e). one Josephson junction is shunted by a plurality of (e.g. three or more, four or more) Josephson junctions.

The types of superconducting qubits illustrated in FIG. 2, panels (a) through (d), are known and other types of superconducting qubits can be used. Additional details with regard to these and other superconducting qubits can be found, for example, in Gu, Xiu, et al. "Microwave photonics with superconducting quantum circuits." *Physics Reports* 718 (2017): 1-102 Kockum, Anton Frisk, and Franco Nori. "Quantum bits with Josephson junctions." *Fundamentals and Frontiers of the Josephson Effect*. Springer, Cham, 2019. 703-741.

The qubit arrays and multiqubit chips may also be composed of a plurality (i.e., two or more) semiconductor qubits. Semiconductor qubits are based on quantum dots—rather than on Josephson junctions. Quantum dots are formed by laterally confining electrons in a quantum well or a two-dimensional electron gas (2DEG) formed within a substrate that is a semiconductor heterostructure. The confinement of electrons or holes within the plane of the quantum well or 2DEG is achieved electrostatically by means of electrical gates. A potential applied to the electrical gates causes the charge carriers (electrons or holes) to become confined in a particular area of the 2DEG or quantum well, resulting in a three-dimensional confinement, and suppresses the interaction between the quantum dots. The interactions between the quantum dots can then be controlled by controlling the gate potentials. Thus, the electrostatic gates define qubits within a heterostructure. The heterostructures in which quantum wells or 2DEGs are formed may be comprised of a variety of semiconductor materials and it is these heterostructures that provide the engineered substrates for the qubit arrays described herein. By way of illustration only, a 2DEG can be formed at an interface between AlGaAs and GaAs, while a silicon quantum well can be formed in a Si/SiGe heterostructure. However, other suitable heterostructures are known.

Figures 3A, 3B, 3C:
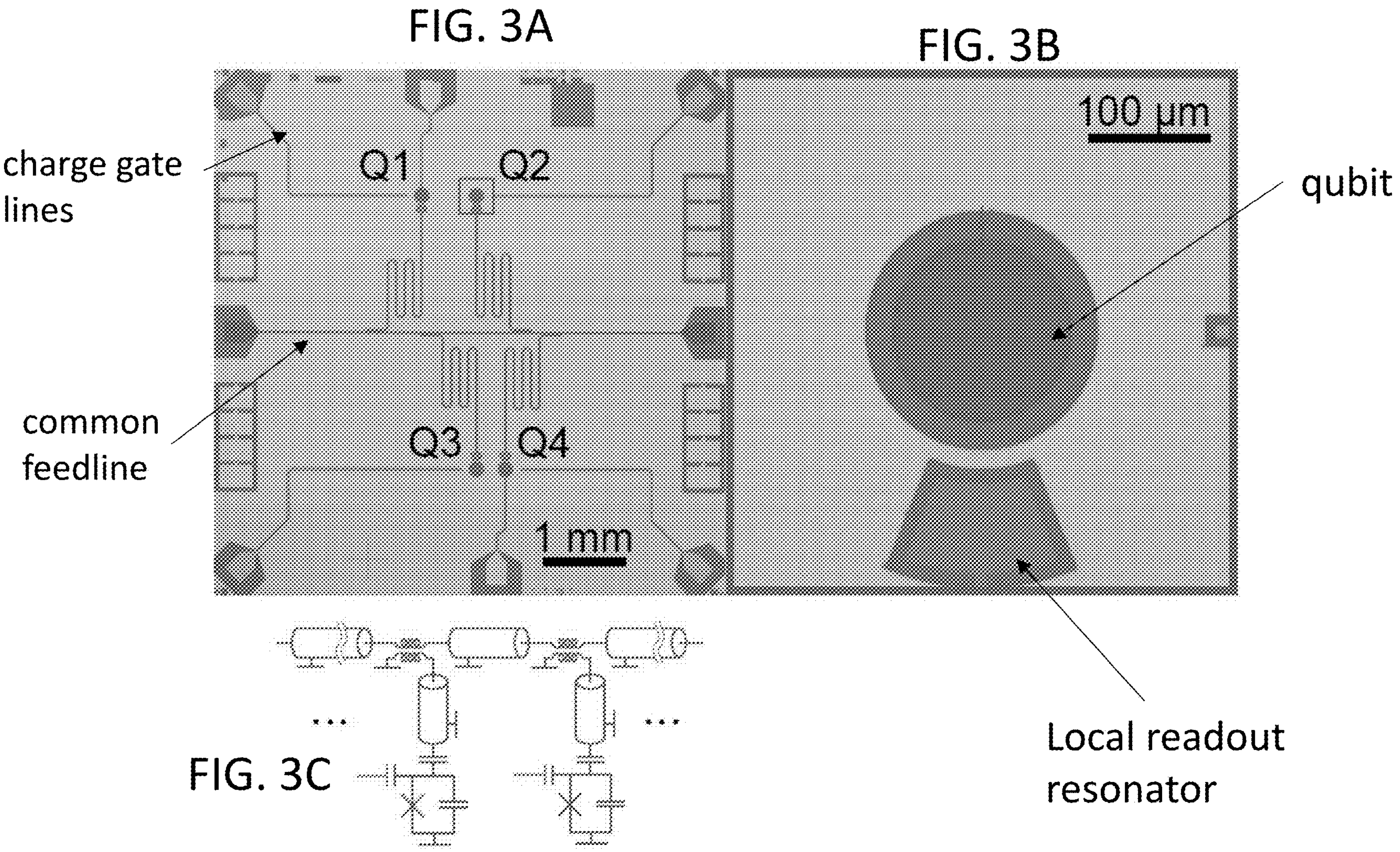
FIG. 3A is an optical micrograph of a multiqubit chip that includes four charge-sensitive transmon qubits that are coupled to local readout resonators and charge gate lines. The readout resonators are coupled to a common feed line.
FIG. 3B is a close-up view of a single transmon qubit in the qubit array of FIG. 3B.
FIG. 3C is a circuit diagram of the qubit chip of FIG. 3A.

In a qubit chip, the qubits will generally be coupled to a readout resonator that is coupled to a transmission line, such as a coplanar waveguide, through which qubit control and readout pulses can be sent. Because most superconducting qubits have resonant frequencies in the microwave range, the resonators and transmission lines will typically be microwave resonators and microwave transmission lines fabricated from low dielectric loss materials. One illustrative example of a qubit chip is shown in FIGS. 3A-3C, which show an optical micrograph of a multiqubit chip that includes four transmon qubits (Q1-Q4) coupled to local readout resonators, which are coupled to a common feed (transmission) line. (Wilen, Christopher D., et al. "Correlated charge noise and relaxation errors in superconducting qubits." *Nature* 594.7863 (2021): 369-373.) However, other qubit chip configurations can be used. For example, other superconducting qubit circuits and additional microwave components that can be incorporated into superconductor qubit chip circuits are described in Gu et al., Physics Reports 718-719 (2017) 1-102, the entire disclosure of which is incorporated herein by reference for the purpose of describing superconductor qubits, superconductor qubit chip circuits, and microwave components for qubit chips.

Correlated errors are errors caused by error mechanisms that affect more than one qubit in an array. Because qubits may be separated by less than a few millimeters (e.g., 100 to 500 microns, or smaller) in a qubit array, error mechanisms that propagate over similar length scales can give rise to correlated errors. Mechanisms that give rise to correlated dephasing and relaxation errors in superconducting and semiconducting qubits can arise from various sources, including ionizing radiation, such as gamma rays from radioactive material or cosmic ray muons. For purposes of illustration, FIG. 1 shows the effect of an ionizing gamma ray on a Josephson junction in a superconducting qubit. The ionizing energy of the gamma ray is absorbed by substrate 108 and converted to electron-hole pairs, which give rise to non-equilibrium phonons in the substrate. The drift of the free charges in substrate 108 gives rise to a fluctuating offset charge that can be sensed by multiple qubits in the array, resulting in correlated dephasing errors. In addition, the phonons can transfer the absorbed energy to the superconducting electrodes 102, 104, where it breaks Cooper pairs and generates quasiparticles that can tunnel through dielectric barrier 106. This quasiparticle poisoning, which can occur over millimeter length scales, gives rise to correlated bit-flip and relaxation errors in the qubit array.

In some embodiments of the qubit arrays, defects are engineered in the crystal structure of the substrate to suppress correlated errors. These defects are referred to herein as engineered defects because they are intentionally formed in the substrate during substrate fabrication. These defects act as traps or recombination centers for the free charge carriers, thereby reducing long-range charge noise that can give rise to correlated dephasing errors. In addition, the defects can provide scattering centers for phonons in the substrate, thereby reducing phonon mean free path, localizing the phonons within the substrate, and reducing correlated relaxation errors. The defects in the crystal form localized electronic states within the substrate semiconductor or insulator bandgap. Free carriers can be energetically trapped by these localized electronic states, restricting their movement and mobility in the substrate crystal, or can be annihilated via recombination on a localized electronic state. As a result, the ability of free carriers to generate correlated dephasing or relaxation errors in the qubit array is suppressed. The electronic states provided by the defects are sufficiently deep in the gap to avoid absorbing the energy of the qubit. Thus, since most superconducting qubits operate at microwave frequencies, the trap states are sufficiently low-lying to avoid microwave loss or to render microwave loss negligible. The defects can be point defects, line defects, impurities, or local stresses, and can be introduced into the substrate during the growth of a substrate crystal using, for example, impurity atom incorporation, or after the substrate has been fabricated using, for example, proton irradiation. The defects are desirably distributed uniformly throughout the bulk of the substrate in order to promote trapping of free charge and phonon scattering throughout the substrate, not just at or near the surface.

One example of a low-loss substrate that can be used for a superconducting or semiconducting qubit is semi-insulating silicon formed by proton irradiation of high resistivity silicon to introduce defects into the crystal. The resulting silicon is referred to as radiation-damaged silicon. The irradiation-induced defects in the semi-insulating silicon are sufficiently low lying to provide a low-loss substrate with reduced charge mobility that suppresses correlated dephasing and/or relaxation errors in a qubit array formed thereon. A description of a semi-insulating silicon and methods for its fabrication is provided in Krupka et al, *Appl. Phys. Lett.* 107, 082105 (2015), the disclosure of which is incorporated herein by reference for the purpose of providing a description of a semi-insulating silicon substrate. Briefly, semi-insulating silicon may be formed from silicon that has been doped with phosphorus to achieve a high resistivity—for example, a resistivity of at least 2000 Ωcm. The doped silicon is then irradiated with protons (e.g., 23 MeV protons) in order to further increase its resistivity via the formation of radiation-induced defect centers in the crystal. For example, semi-insulating silicon can have a resistivity of at least $2\times10^5$ Ωcm. The resistivity of the semi-insulating silicon will depend on the particular dopants, dopant concentrations, and radiation parameters (e.g., energy and fluence) used in its fabrication. However, the semi-insulating silicon will be characterized by a resistivity and defect density that is greater than that of intrinsic silicon. While semi-insulating silicon is exemplified here, other semi-insulting (radiation-damaged—particularly proton-damaged) semiconductors can also be used as correlated error-suppressing substrates. The radiation-induced defects in the semi-insulating semiconductor substrates may be distributed uniformly through the substrate or may be concentrated near the surface of the substrate on which and/or into which the qubits are formed. Radiation-induced defects include atom-displacements that can create point defects, such as interstitials or vacancies (e.g., atom vacancies), as well as more complex combinations of these, such as di-vacancies, di-interstitials, and/or triple-vacancies.

In some embodiments of the qubit arrays, the substrate is patterned to provide geometric confinement of non-equilibrium phonons or drifting free charge in order to limit the effects of the phonons and charge to no more than one qubit in a qubit array. Optionally, the patterned substrate can include defect traps in its crystal structure, as described above. The features, which may be patterned into one or more surfaces of a substrate or incorporated into its internal structure, can take on a variety of forms, but will generally increase the surface area of interfaces at which charge carriers can be trapped or recombine and/or from which phonons can scatter diffusively. The features can include one or more structures, such as wells, trenches, constrictions, and inclusions. For the purposes of this disclosure, wells are openings that extend into the substrate from an opening at a substrate surface. Wells may have a circular lateral cross-section, but other cross-sectional shapes, such as square, triangular, or hexagonal can also be used. Trenches are wells that are elongated in a lateral direction. Trenches may be linear and/or curved. Constrictions are portions of a substrate where the substrate material has been thinned. Constrictions can be formed, for example, by wells or trenches defined in the backside of the substrate; that is—in the surface of the substrate opposite a surface on which and/or into which qubits are formed. Inclusions are discrete pieces of material embedded within the substrate and made from a material other than the material from which the substrate is made.

Features, such as wells and trenches, that are etched into the backside of the substrate may extend through most of the substrate thickness. For example, wells, trenches, and other features may extend through at least 70%, at least 80%, at least 90%, or at least 95% of the substrate thickness. The structures may have a periodic or non-periodic arrangement. The features are designed to provide geometric confinement of the phonons and/or redirection of the phonons away from qubits, thereby reducing their ability to generate correlated errors. The features can be formed uniformly throughout the substrate or through only a portion of the substrate. For example, wells can be concentrated below individual qubits or can be concentrated in portions of the substrate between qubits. Features that are concentrated below the qubits may be concentrated below the Josephson junctions of the qubits.

The dimensions of the geometric features will depend on the dimensions of the qubits and the thickness of the substrate in which they are defined. Generally, the substrate and/or the geometric features will have micron-scale dimensions—that is, dimensions of 1000 μm or less (for example, dimensions in the range from 10 μm to 1000 μm); however, larger dimensions can be used. The micron-scale dimensions include micro-scale well depths, well diameters, and/or well pitch (center-to-center well spacing), trench depths, trench widths, and/or trench lengths, constriction depths, and/or constriction widths. By way of non-limiting illustration only, micron-scale dimensions include: well and/or trench depths of 200 μm to 300 μm; and/or well diameters and/or trench widths of 10 μm to 100 μm, including from 20 μm to 80 μm; and/or well pitch from 50 μm to 200 μm; and/or constriction thicknesses of 50 μm to 200 μm, including from 100 μm to 150 μm. These illustrative dimensions can be used for geometric features defined in substrates having a thickness of 500 μm or less, including substrates having a thickness of 400 μm or less (for example, a thickness in the range from 200 μm to 500 μm or from 300 μm to 400 μm). However, they can also be used in substrates of other thicknesses.

Figures 4A, 4B:
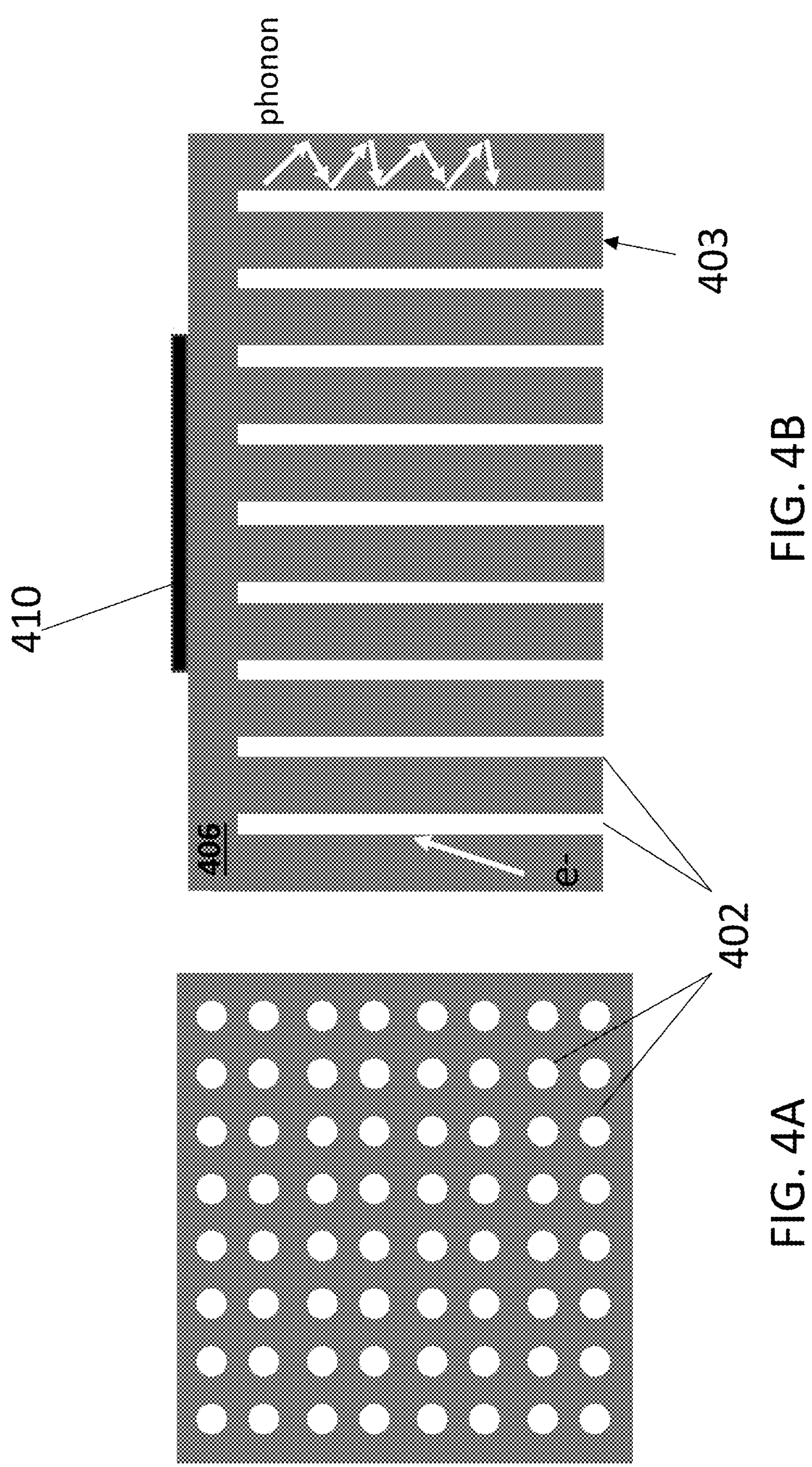
FIGS. 4A and 4B show a lateral cross-sectional view and a cross-sectional side view, respectively, of a substrate for a qubit array having a series of deep wells etched into its backside surface.

The geometric substrate features may be defined by a plurality of deep trenches and/or wells backside etched into the substrate. For example, as illustrated in FIGS. 4A (lateral cross-sectional view) and 4B (cross-sectional side view), an array of wells 402 can be formed in the backside 403 of a substrate 406 having a plurality of qubits 410 on its upper surface (for simplicity, only a portion of substrate 406 having a single qubit 410 formed thereon is shown). Phonons (represented by white arrows) generated in the substrate scatter from the interfaces formed by the wells. As a result, the mean free path of the phonons in the substrate will be reduced and the phonons will become more localized, resulting in a reduction in correlated errors. Because the qubits may take on a variety of forms, as discussed above, they are simplified as back rectangles in the figures.

Defects at the substrate/vacuum interfaces provided by the patterned features may also serve as charge traps and/or recombination centers, thereby suppressing correlated errors due to charge noise. Because surfaces and interfaces typically contain a large number of carrier trap states and/or recombination centers, features patterned into the substrate that increase the surface/volume ratio of the substrate can increase carrier trapping and recombination.

Figures 5A, 5B:
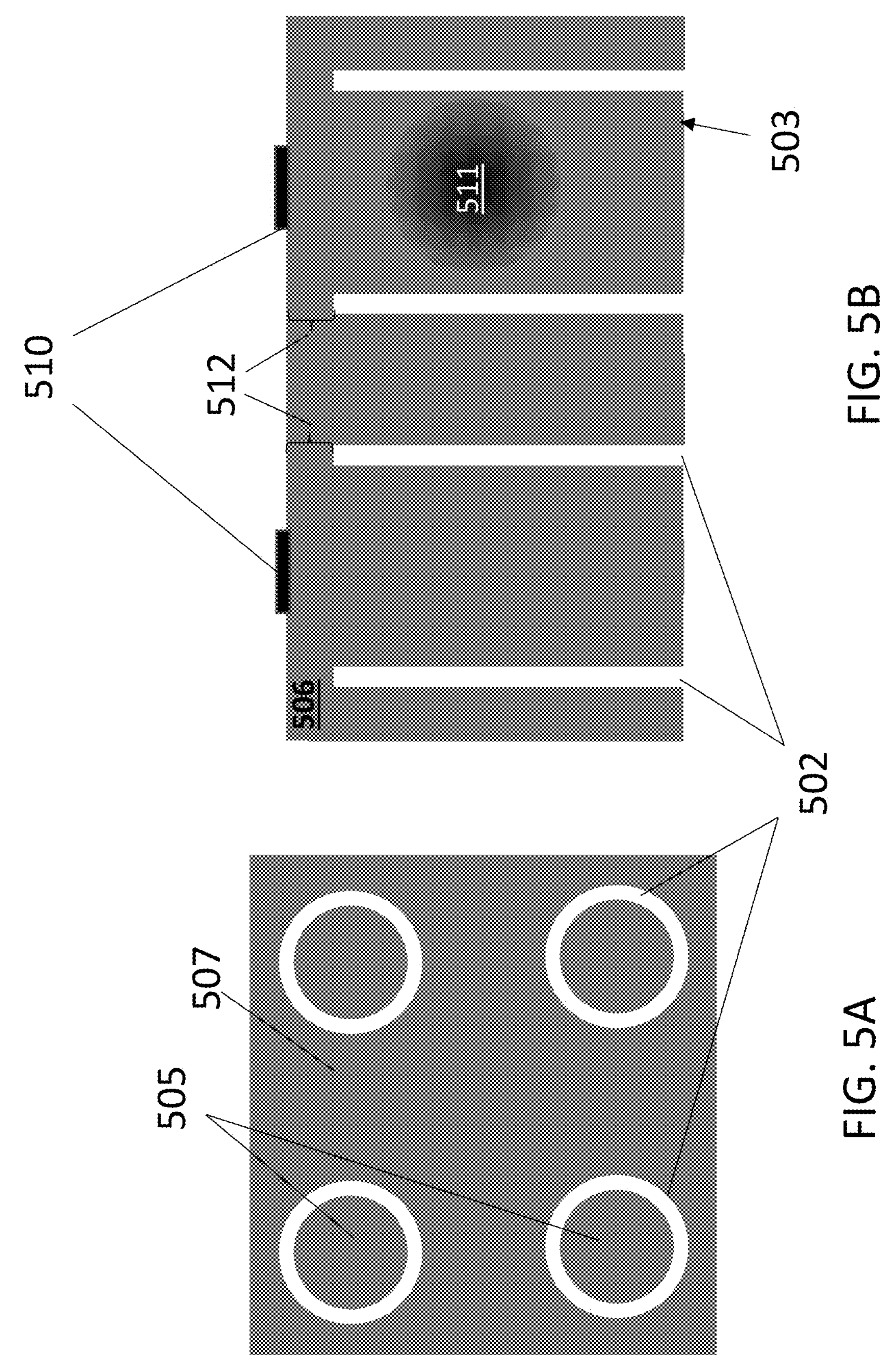
FIGS. 5A and 5B show a lateral cross-sectional view and a cross-sectional side view, respectively, of a substrate for a qubit array having a series of deep circular trenches (circular "moats") etched into its backside surface.

FIG. 5A (lateral cross-sectional view through the moats) and 5B (cross-sectional side view) show another embodiment of a substrate that is geometrically patterned to reduce correlated errors in a qubit array. In this embodiment, trenches 502 are patterned into the backside 503 of a substrate 506 to form "moats" surrounding overlying qubits 510. The moats are trenches that enclose portions 505 of the substrate below a qubit. While the moats in FIGS. 5A and 5B have a circular horizontal cross-section, they may have other cross-sectional shapes, such as square, triangular, hexagonal, etc. The moats create constrictions 512 in substrate 506 between qubits. These constrictions act as bottlenecks for the propagation of phonons and/or charge carriers in the substrate. (It should be understood that qubit 510 is considered "surrounded" by a moat 502 even though the moat does not extend up to the substrate surface on which qubit 510 is supported and, as a result, qubit 510 is offset vertically from moat 502. Thus, for the purposes of this disclosure, a moat is said to "surround" a qubit provided that the constrictions formed by the moat surround the qubit, as depicted in FIGS. 5A and 5B.) As a result of the constrictions, the free charges and phonons generated by the absorption of ionizing radiation 511 inside of the moat boundary are spatially localized within portions 505 of substrate 506 surrounded by moats 502. Similarly, free charges and phonons generated in substrate 507 outside of the moat boundaries become spatially localized outside of the moats. The overall affect is to limit the error-generating effect of the phonons and charges to no more than one qubit in the array. In addition, as in the embodiment of FIGS. 4A and 4B, defects at the substrate/vacuum interfaces provided by the trenches can also serve as charge traps and/or recombination centers.

Figures 6A, 6B:
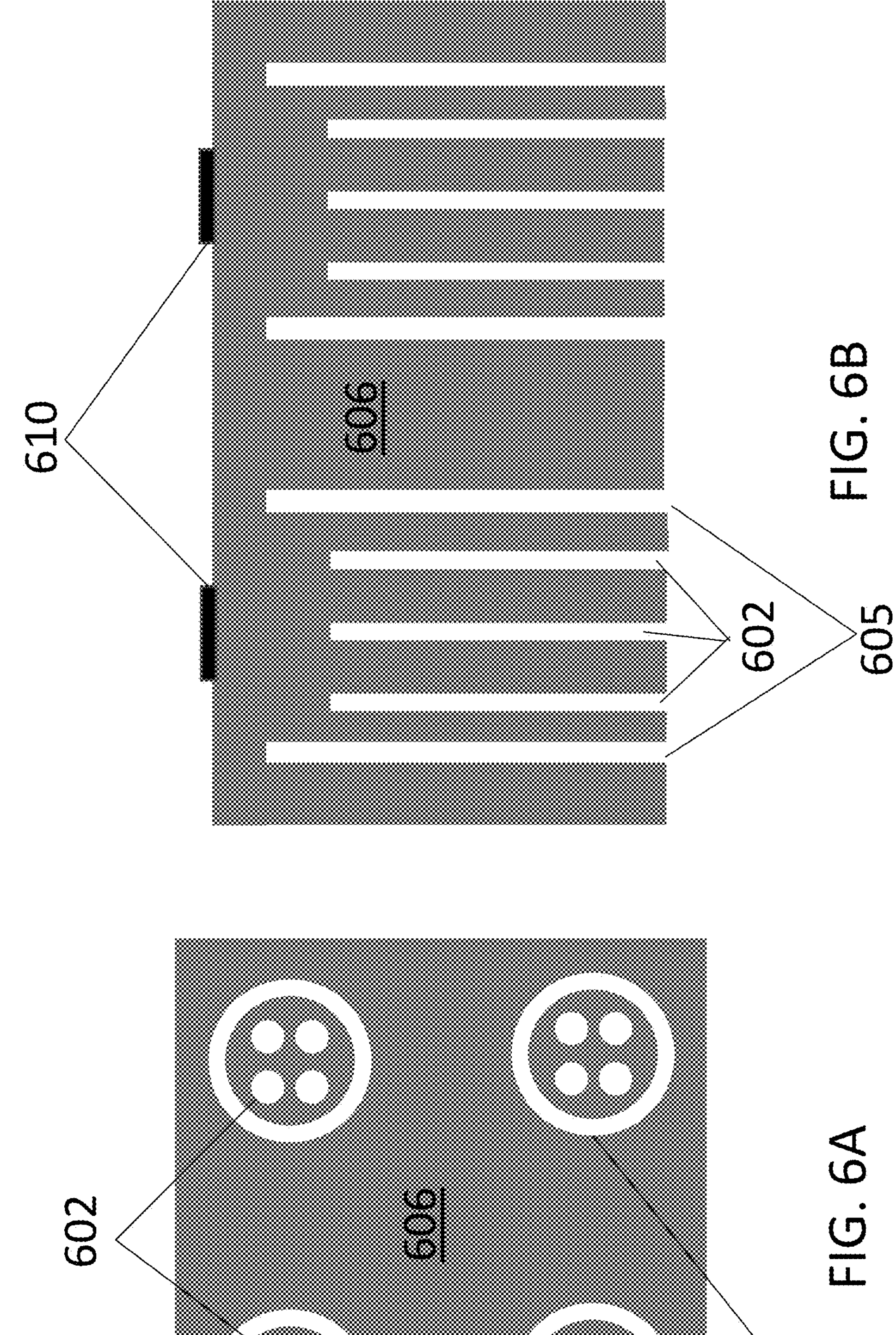
FIGS. 6A and 6B show a lateral cross-sectional view and a cross-sectional side view, respectively, of a substrate for a qubit array having a series of deep circular trenches (circular "moats") etched into its backside surface, with a plurality of deep wells etched within the moat boundaries

More complex substrate geometries can be used to provide phonon localization and redirection away from the array qubits. For example, FIG. 6A (lateral cross-sectional view) and 6B (cross-sectional side view) depict an embodiment of a substrate 606 that incorporates deep wells 602 within the portions of substrate 606 enclosed moats 605 that are localized below and surround qubits 610 on the substrate surface.

Figures 7A, 7B:
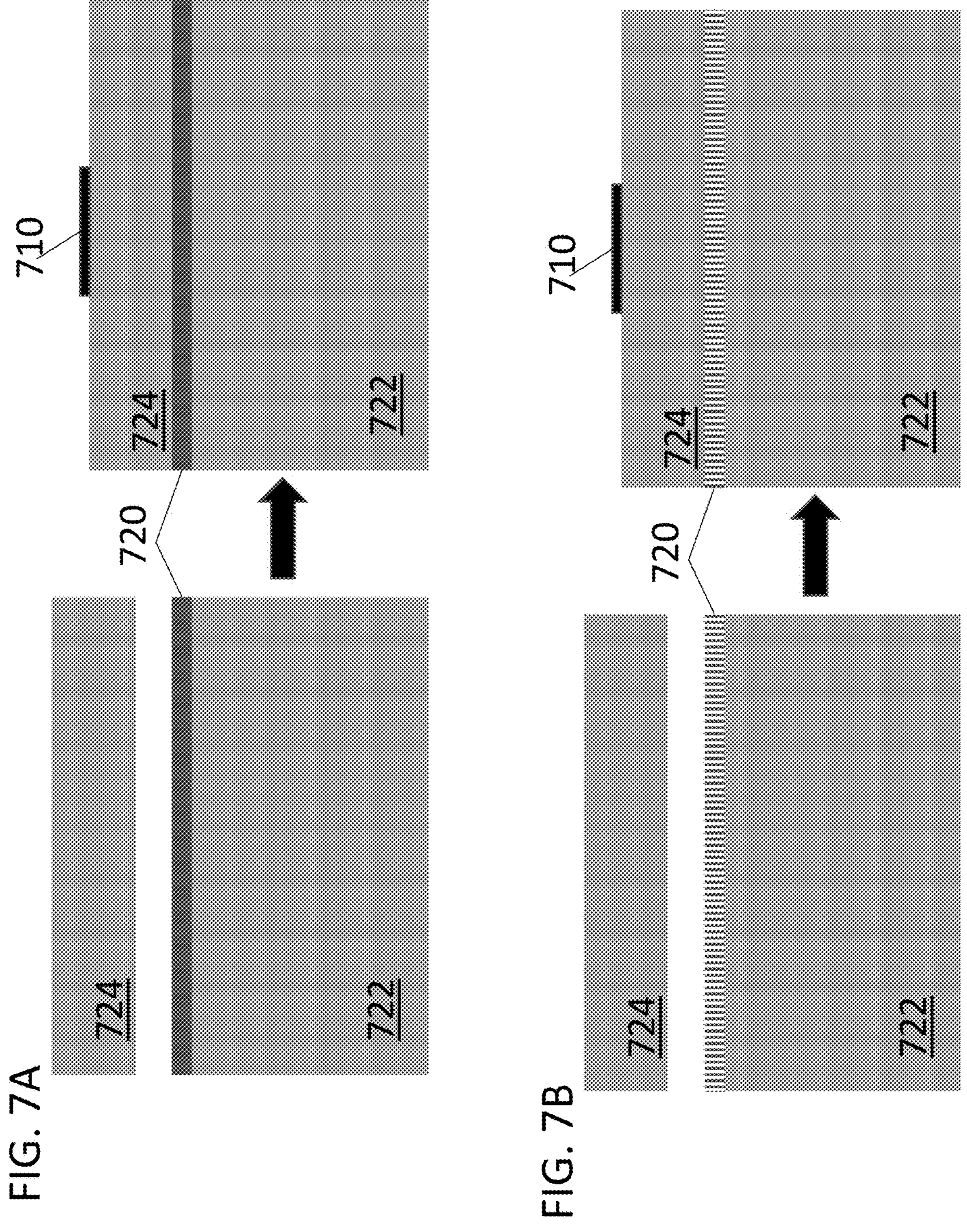
FIG. 7A is a cross-sectional side view of a substrate for a qubit array that incorporates a continuous intervening electrostatic shielding and/or charge trapping layer and is made by wafer bonding.
FIG. 7B is a cross-sectional side view of a substrate for a qubit array that incorporates a discontinuous intervening electrostatic shielding and/or charge trapping layer comprising a plurality of vertical pillars.
Figure 8:
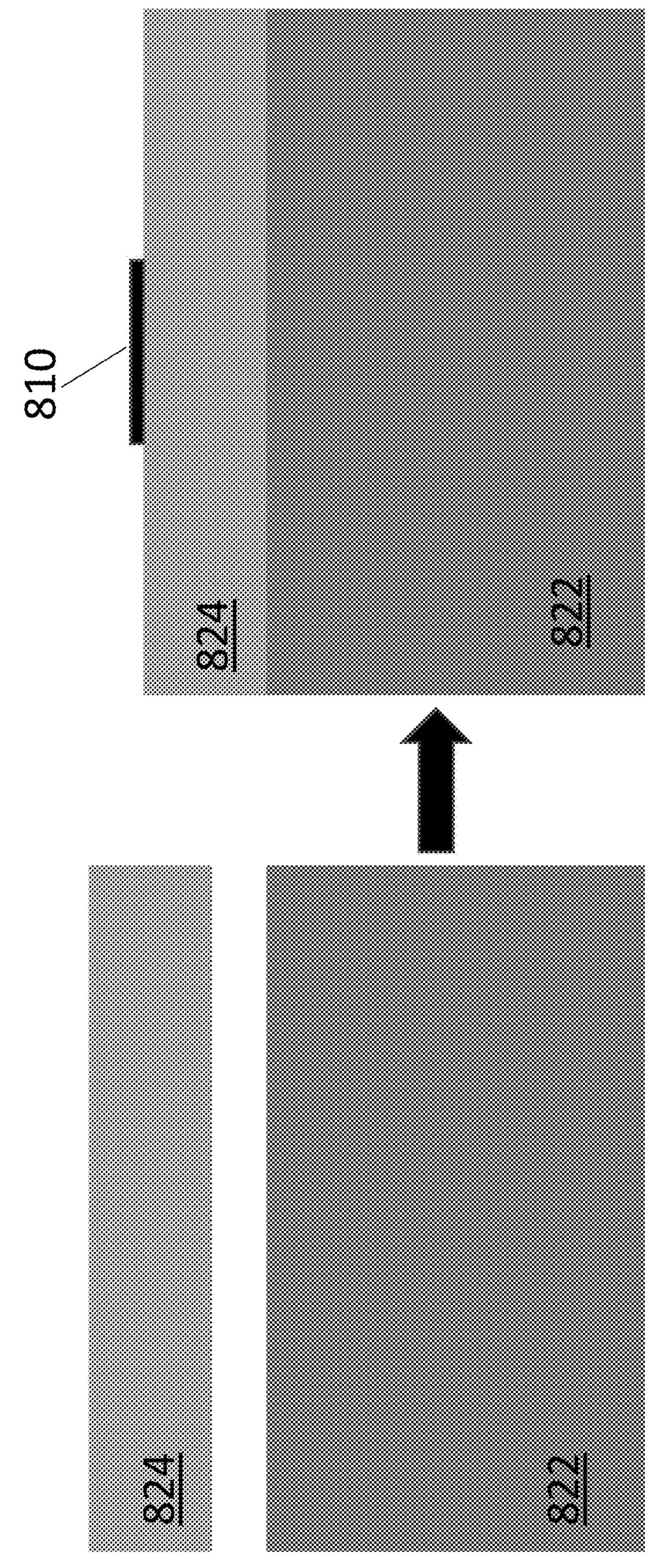
FIG. 8 is a cross-sectional side view of a substrate for a qubit array that includes electrostatic shielding and/or charge trapping support substrate layer and is made by wafer bonding.

In some embodiments of the qubit arrays, the substrate is engineered to provide electrostatic screening to dampen the effect of the electric fields associated with the free carriers generated by the absorption of radiation by the substrate. In this way, the substrates suppress correlated errors due to long-range charge fluctuations in the substrate. The electrostatic screening can be accomplished using a multilayered substrate that includes a layer of highly doped or electrically conductive (including superconductive) material (a "screening layer") that provides a grounded Faraday shield or cage and/or charge trapping layer in the substrate, as illustrated in FIGS. 7A, 7B and 8. The screening and/or trapping layer (screening/trapping layer) may be buried in the substrate (an interlayer) or may be an underlying sub-layer of the substrate. In the embodiment depicted in FIGS. 7A and 7B, screening/trapping layer 720 is incorporated as an interlayer in a multilayered qubit array substrate (720/722). This can be accomplished by growing or depositing screening/trapping layer 720 on a support substrate 722 and wafer bonding a qubit substrate overlayer 724 on screening/trapping layer 720. The array of qubits 710 is then formed on qubit substrate overlayer 724. Qubit substrate overlayer 724 may be formed from materials that are suitable for use as substrates for superconducting or semiconducting qubit arrays, and support substrate 722 and qubit substrate overlayer 724 may be, but need not be, made of the same material. High resistivity single-crystalline silicon is one example of a suitable qubit substrate overlayer.

Screening/trapping layer 720 screens qubits 710 from the electric fields produced by the motion of free charges that are generated below the screening/trapping layer in the substrate. In addition, this layer inhibits the drift of charge from the thicker handle substrate to the device layer. The screening/trapping layer may be a continuous layer (FIG. 7A) or a discontinuous layer, such as a mesh or an array of highly doped or electrically conductive inclusions, such as pillars (FIG. 7B) embedded in the substrate. The screening/trapping layer may extend under all of the qubits in the qubit array, under only a sub-set of the qubits, or may form one or more Faraday cages surrounding one or more of the qubits. Materials that absorb in the microwave regime can be used for the screening/trapping layer. However, in order to avoid significant qubit performance degradation, it is preferable to use a screening/trapping layer that is sufficiently thin to avoid performance degradation to a degree that would render the qubits unsuitable for their intended purpose.

In an alternative embodiment, the electrostatic shielding and charge trapping can be provided by a highly doped or electrically conducting support substrate sub-layer 822 disposed below a qubit substrate overlayer 824 on which an array of qubits 810 is formed, as illustrated in FIG. 8. Such bilayered substrates can be formed by, for example, wafer bonding. Free charge carriers will not propagate over long distances in support substrate sub-layer 822. Materials that absorb in the microwave regime can be used for support substrate sub-layer 822. However, in order to avoid significant qubit performance degradation, the qubit substrate overlayer 824 should be sufficiently thick to avoid qubit signal loss from a high loss substrate sub-layer 822.

Figure 9:
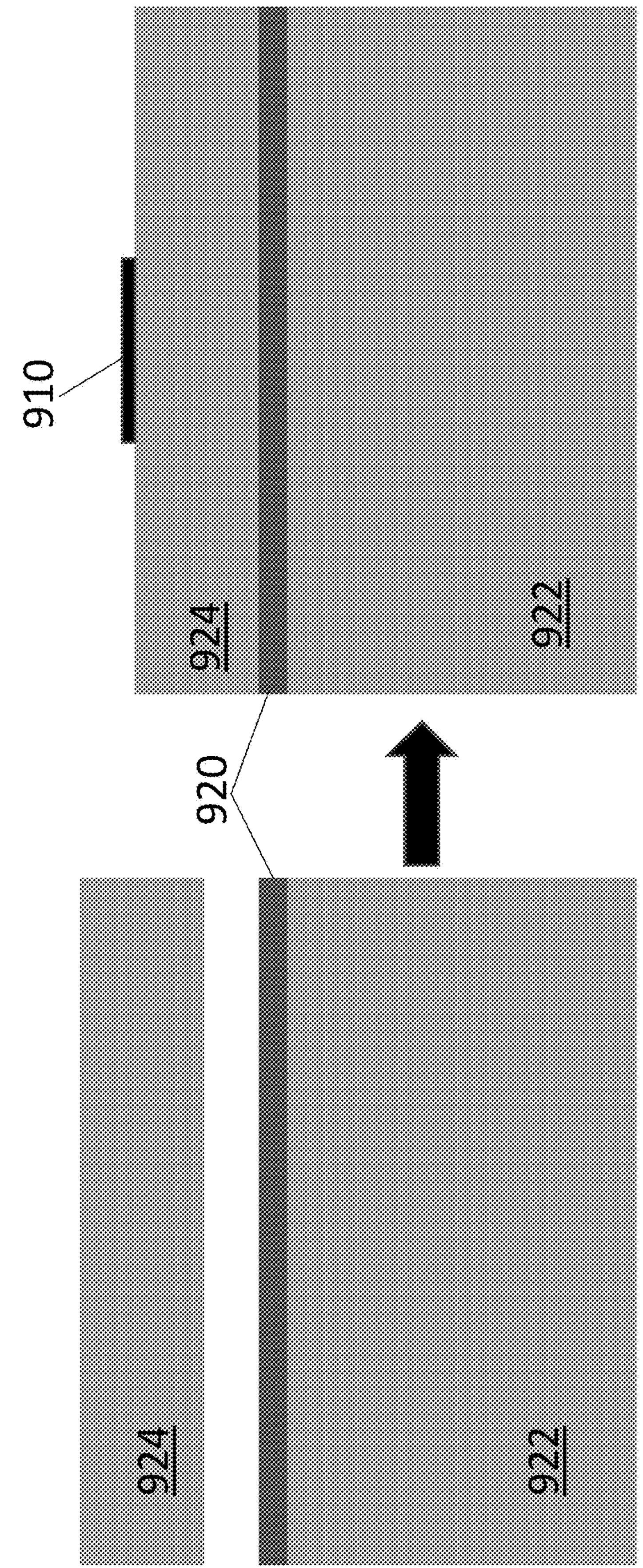
FIG. 9 is a cross-sectional side view of a substrate for a qubit array that incorporates an intervening phonon blocking layer and is made by wafer bonding.
Figure 10:
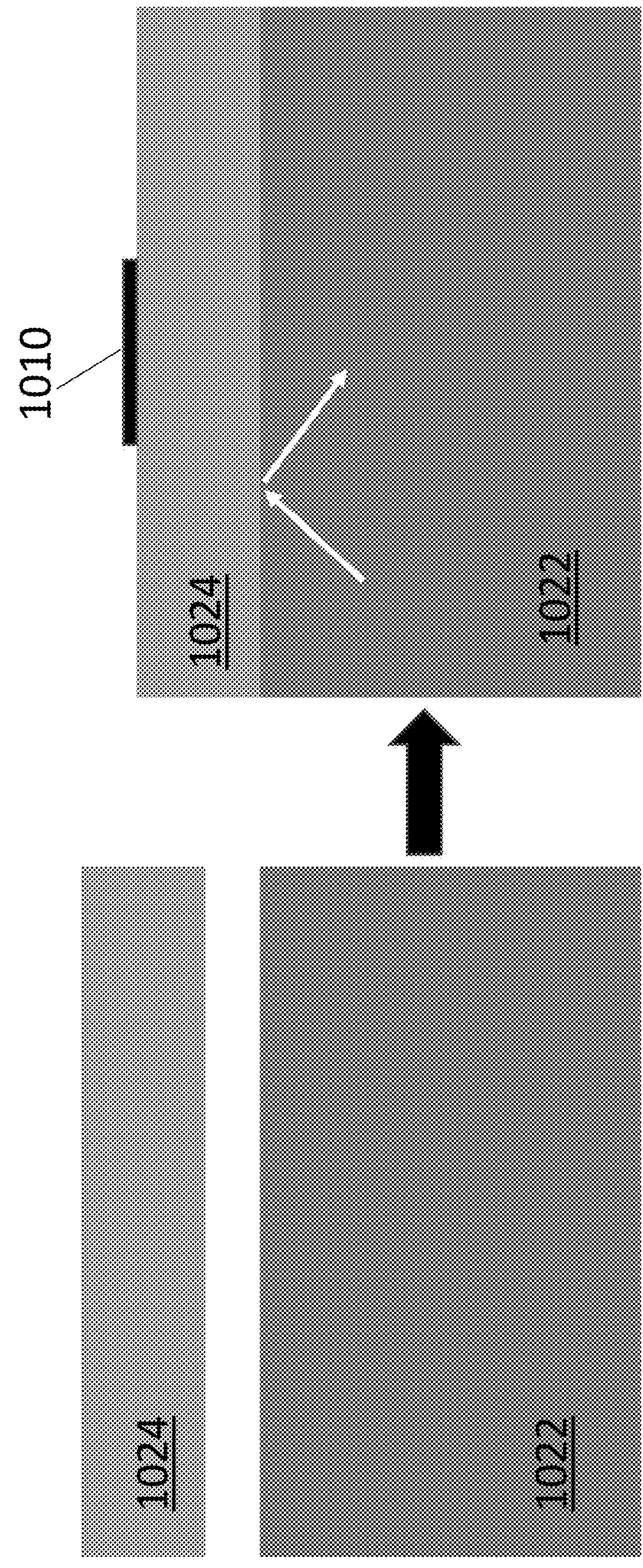
FIG. 10 is a cross-sectional side view of a substrate for a qubit array that includes a phonon blocking support substrate layer.

In some embodiments of the qubit arrays, the substrate is engineered to block phonon propagation in the substrate. In this way, the substrates reduce correlated errors due to long-range phonon propagation. Phonon blocking can be accomplished using a multilayered substrate that includes a layer of material that has a high acoustic impedance mismatch with the qubit substrate material (a "phonon blocking layer"), as illustrated in FIGS. 9 and 10. This blocking layer could also be a multilayered heterostructure with multiple acoustic impedance mismatches between the individual layers. The phonon blocking layer may be buried in the substrate (an interlayer) or may be an underlying sub-layer of the substrate. In the embodiment depicted in FIG. 9, a phonon blocking layer 920 is incorporated as an interlayer in a multilayered qubit substrate. This can be accomplished by growing or depositing phonon blocking layer 920 on a support substrate 922 and wafer bonding a qubit substrate overlayer 924 on phonon blocking layer 920. The array of qubits 910 is then formed on qubit substrate overlayer 924. Qubit substrate overlayer 924 may be formed from materials that are suitable for use as substrates for superconducting or semiconducting qubit arrays, and support substrate 922 and qubit substrate overlayer 924 may be, but need not be, made of the same material. High resistivity single-crystalline silicon is one example of a suitable qubit substrate overlayer. Suitable materials for the phonon blocking layer include metals, such as tungsten and tantalum, and heavy oxides or silicides, such as tungsten or tantalum oxides and silicides, which have an acoustic impedance mismatch with known qubit substrate materials, such as silicon.

In an alternative embodiment, the phonon blocking layer can be provided by a support substrate sub-layer 1022 having an acoustic impedance mismatch that is disposed below a qubit substrate overlayer 1024 on which an array of qubits 1010 is formed, as illustrated in FIG. 10. Such bilayered substrates can be formed by, for example, wafer bonding. Non-equilibrium phonons (white arrows) propagating in support substrate 1022 will reflect from the interface between qubit substrate overlayer 1024 and support substrate sub-layer 1022 due to the acoustic impedance mismatch and, therefore, correlated errors in the qubits will be suppressed.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can be mean only one or can mean "one or more." Embodiments of the inventions consistent with both constructions are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A qubit array comprising at least two qubits on or in a crystalline substrate, the crystalline substrate having a plurality of engineered defects in its crystal structure, wherein the engineered defects form traps or recombination centers for free charge carriers in the crystal structure to suppress correlated dephasing errors or correlated relaxation errors in the qubits of the qubit array.

2. The qubit array of claim 1, wherein the at least two qubits are superconducting qubits.

3. The qubit array of claim 1, wherein the crystalline substrate is a single-crystal silicon substrate.

4. The qubit array of claim 1, wherein the engineered defects are distributed uniformly throughout the bulk of the crystalline substrate.

5. The qubit array of claim 1, wherein the engineered defects are radiation-induced defects.

6. The qubit array of claim 5, wherein the radiation-induced defects are proton irradiation induced defects.

7. The qubit array of claim 4, wherein the crystalline substrate is radiation-damaged, semi-insulating silicon.

8. The qubit array of claim 7, wherein the at least two qubits are superconducting qubits.

9. The qubit array of claim 4, wherein the crystalline substrate has a plurality of geometric features defined therein, wherein the geometric features increase a surface area of interfaces at which free charge carriers are trapped or recombine and/or from which phonons scatter diffusively to suppress correlated dephasing errors or correlated relaxation errors in the qubits of the qubit array.

10. The qubit array of claim 9, wherein the geometric features comprise wells defined in a backside of the crystalline substrate, trenches defined in a backside of the crystalline substrate, constrictions in the crystalline substrate, inclusions in the crystalline substrate, or a combination of two or more of these.

11. The qubit array of claim 1, wherein the engineered defects are point defects, line defects, or impurities in the crystal structure of the crystalline substrate.

12. The qubit array of claim 4, wherein the engineered defects are point defects, line defects, or impurities in the crystal structure of the crystalline substrate.

13. The qubit array of claim 1, wherein the crystalline substrate comprises radiation-damaged, semi-insulating silicon.

14. A qubit array comprising at least two qubits on or in a substrate, the substrate having a plurality of geometric features defined therein, wherein the geometric features increase a surface area of interfaces at which free charge carriers are trapped or recombine and/or from which phonons scatter diffusively to suppress correlated dephasing errors or correlated relaxation errors in the qubits of the qubit array.

15. The qubit array of claim 14, wherein the at least two qubits are superconducting qubits.

16. The qubit array of claim 14, wherein the crystalline substrate is a single-crystal silicon substrate.

17. The qubit array of claim 14, wherein the geometric features comprise wells defined in a backside of the substrate, trenches defined in a backside of the substrate, constrictions in the substrate, inclusions in the substrate, or a combination of two or more of these.

18. The method of claim 17, wherein the at least two qubits are superconducting qubits and substrate is a silicon substrate.

19. The qubit array of claim 14, wherein the geometric features are localized below or concentrated below the at least two qubits.

20. The qubit array of claim 14, wherein the geometric features comprise constrictions in the substate that surround the qubits of the qubit array.

* * * * *